United States Patent
Rouh et al.

(10) Patent No.: US 7,538,003 B2
(45) Date of Patent: May 26, 2009

(54) METHOD FOR FABRICATING MOS TRANSISTOR

(75) Inventors: Kyoung Bong Rouh, Gyeonggi-do (KR); Min Yong Lee, Seoul (KR); Yong Soo Joung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 53 days.

(21) Appl. No.: 11/646,992

(22) Filed: Dec. 28, 2006

(65) Prior Publication Data
US 2008/0003756 A1    Jan. 3, 2008

(30) Foreign Application Priority Data
Jun. 29, 2006    (KR) .............. 10-2006-0059902

(51) Int. Cl.
*H01L 21/336*    (2006.01)
*H01L 21/425*    (2006.01)

(52) U.S. Cl. ............... 438/302; 438/197; 438/301; 438/514; 438/516; 257/E21.337; 257/E21.433; 257/E21.269

(58) Field of Classification Search .......... 438/197, 438/301, 302, 514; 257/607, E21.337, E21.433, 257/E21.269
See application file for complete search history.

(56) References Cited

U.S. PATENT DOCUMENTS

| | | | | |
|---|---|---|---|---|
| 5,096,854 A | * | 3/1992 | Saito et al. | 438/406 |
| 5,897,346 A | * | 4/1999 | Yamaguchi et al. | 438/162 |
| 6,037,230 A | * | 3/2000 | Holloway | 438/289 |
| 6,586,781 B2 | * | 7/2003 | Wu et al. | 257/194 |
| 6,627,502 B1 | | 9/2003 | Cho | 438/265 |
| 6,673,722 B1 | * | 1/2004 | Yamazaki | 438/728 |
| 6,936,518 B2 | * | 8/2005 | Hwang et al. | 438/299 |
| 6,998,318 B2 | | 2/2006 | Park | 438/174 |
| 2005/0133835 A1 | * | 6/2005 | Bu et al. | 257/288 |
| 2006/0043531 A1 | * | 3/2006 | Erokhin et al. | 257/607 |
| 2006/0148151 A1 | * | 7/2006 | Murthy et al. | 438/197 |

FOREIGN PATENT DOCUMENTS

JP    08-335560    12/1996

* cited by examiner

*Primary Examiner*—Walter L Lindsay, Jr.
*Assistant Examiner*—Mohsen Ahmadi
(74) *Attorney, Agent, or Firm*—Marshall, Gerstein & Borun LLP

(57) ABSTRACT

A method for fabricating a metal oxide semiconductor (MOS) transistor comprises forming a source region of a first conductivity type and a drain region of the first conductivity type, which are separated from each other by a channel region, in upper regions of a semiconductor substrate, forming a gate stack on the channel region, and feeding hydrogen into junctions of the source and drain regions to neutralize dopants of the first conductivity type present within particular portions of the junctions.

5 Claims, 4 Drawing Sheets

US 7,538,003 B2

METHOD FOR FABRICATING MOS TRANSISTOR

BACKGROUND OF THE INVENTION

The invention relates to a method for manufacturing a semiconductor device, and more particularly to a method for fabricating a metal oxide semiconductor (MOS) transistor.

Increasing degrees of integration of semiconductor devices have resulted in a dramatic reduction in the effective channel length of MOS transistors in such semiconductor devices, causing many problems due to the short-channel effects. A number of techniques, for example, techniques associated with the formation of recessed channels, have been proposed to increase the effective channel length of the devices without an increase in the degree of integration of the devices. However, there is a limitation in increasing the degree of integration of devices while ensuring the effective channel length of the devices.

Due to increased concentration of a dopant in a source region and a drain region of MOS transistors of a semiconductor memory device, particularly dynamic random access memory (DRAM) devices, the intensity of an electric field applied to the source and drain regions is gradually increasing. As a result, the level of a voltage, at which a punch-through phenomenon is caused wherein a depletion region of the source region is connected to that of the drain region, is lowered to cause malfunctioning of the DRAM device. The increased electric field enables the occurrence of hot carriers, leading to a degradation in the electrical properties of the device. Further, the increased electric field causes a leakage current, leading to a deterioration in the refresh characteristics of the device.

Halo ion implantation has been employed to avoid these undesirable phenomena. According to halo ion implantation, a source region and a drain region doped with a high-concentration dopant of a first conductivity type, e.g., a p+ dopant, are counter-doped with a dopant of a second conductivity type, i.e. an n-type dopant, to decrease the concentration of the dopant in the source and drain regions, thus achieving a reduction in the intensity of an electric field applied to the source and drain regions.

However, the halo ion implantation using counter doping may cause a decrease in the concentration of the dopant in the source region and the drain region, resulting in a degradation in the driving current characteristics of devices. It is also known that known ion implantation techniques have a difficulty in reducing an electric field at a particular depth through local concentration control. Thus, halo ion implantation may result in a reduction in the total concentration of a dopant in junctions of a source region and a drain region, thus achieving a reduction in electric field but causing unwanted degradation of device characteristics.

SUMMARY OF THE INVENTION

Accordingly, the invention provides a method for fabricating a MOS transistor, the method comprising the steps of: forming a source region of a first conductivity type and a drain region of the first conductivity type, which are separated from each other by a channel region, in upper regions of a semiconductor substrate; forming a gate stack over the channel region; and, feeding hydrogen into junctions of the source and drain regions to neutralize dopants of the first conductivity type present within particular portions of the junctions.

The hydrogen is preferably fed by implantation.

The particular portions of the junctions are preferably controlled by varying the energy required for the implantation of the hydrogen.

The amount of the dopants of the first conductivity type to be neutralized in the junctions is preferably controlled by varying the dose of the hydrogen implanted.

The hydrogen is preferably fed by hydrogen annealing within a furnace, wherein the particular portions of the junctions and the amount of the dopants of the first conductivity type to be neutralized are preferably controlled by varying the internal temperature of the furnace and the amount of the hydrogen fed by the hydrogen annealing.

The hydrogen is preferably fed by hydrogen annealing using rapid thermal processing, wherein the particular portions of the junctions and the amount of the dopants of the first conductivity type to be neutralized are preferably controlled by varying the temperature for the rapid thermal processing and the amount of the hydrogen fed by the hydrogen annealing using rapid thermal processing.

The dopants of the first conductivity type are preferably boron (B) ions or $BF_2$ ions.

The method of the invention preferably further comprises the step of forming a well region of a second conductivity type surrounding the channel, source and drain regions.

DETAILED DESCRIPTION OF PREFERRED EMBODIMENTS

Figure 1:
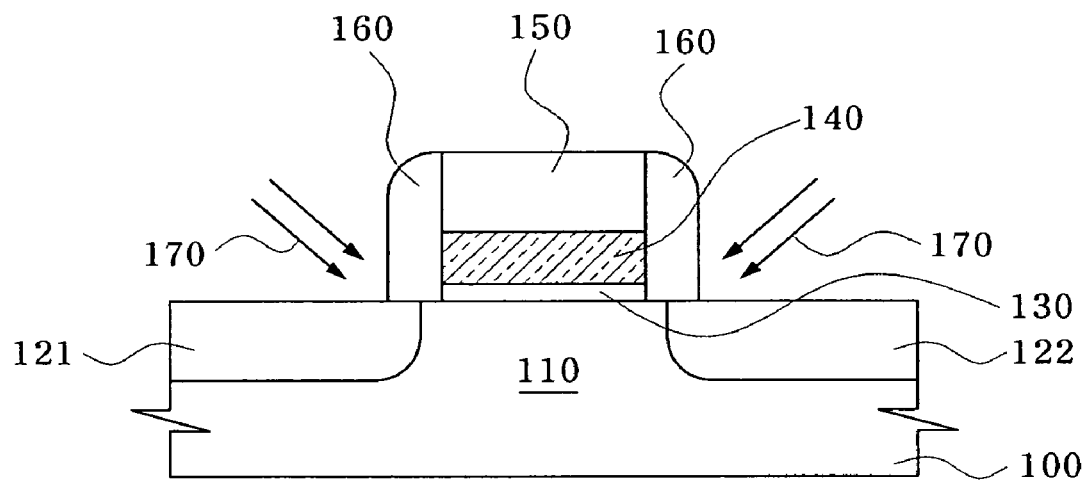
FIG. 1 is a cross-sectional view illustrating a method for fabricating a MOS transistor according to one embodiment of the invention.

FIG. 1 is a cross-sectional view illustrating a method for fabricating a MOS transistor according to one embodiment of the invention. FIGS. 2 through 5 are graphs illustrating changes in the concentration of dopants in a junction of a MOS transistor fabricated in accordance with a method of the invention. With reference to FIG. 1, a gate insulating layer pattern 130, a gate conductive layer pattern 140, and a gate hardmask layer pattern 150 are sequentially formed on a semiconductor substrate 100 (e.g., a silicon substrate) to form a gate stack. Gate spacers 160 are formed on sidewalls of the gate stack. Impurity ions are implanted into exposed portions of the semiconductor substrate 100 by a common ion implantation process to form a source region 121 and a drain region 122. A channel region 110 is defined to a region between the source region 121 and the drain region 122. In order to form junctions of a lightly doped drain (LDD) structure (not shown), the impurity ions may be implanted at a relatively low concentration to form source/drain extension regions (not shown) before the formation of the gate spacer 160. Further, a well region of a conductivity type opposite to that of the source and drain regions 121 and 122 may be formed in an upper region of the semiconductor substrate 100 before the formation of the gate stack.

As indicated by the arrows 170 in FIG. 1, hydrogen is implanted to reduce the concentration of the dopants in a particular portion of the interface (i.e. a source junction) between the source region 121 and the channel region 110, and in a particular portion of the interface (i.e. a drain junction) between the drain region 122 and the channel region 110. In the case where the MOS transistor is a p-channel MOS transistor, boron (B) ions or $BF_2$ ions at a high concentration are implanted into the source region 121 and the drain region 122. When hydrogen is implanted into the source and drain junctions by hydrogen implantation, the hydrogen serves to neutralize the B ions or $BF_2$ ions present in particular portions of the source and drain junctions, resulting in a reduction in the concentration of the B ions or $BF_2$ ions in the particular portions.

Figure 2:
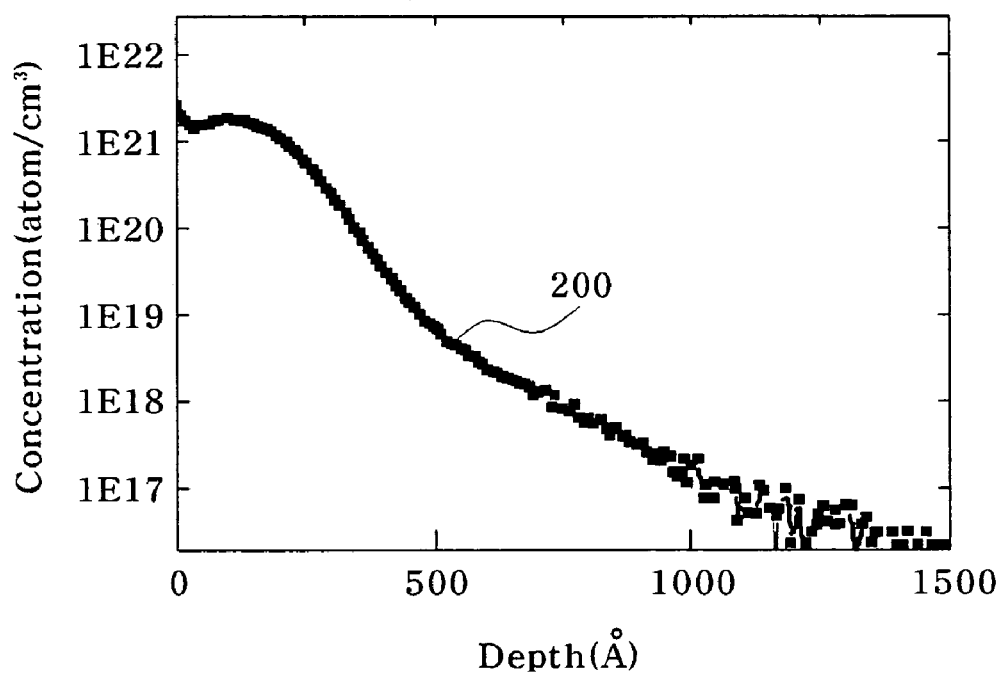
FIGS. 2 through 5 are graphs illustrating changes in the concentration of dopants in a junction of a MOS transistor fabricated in accordance with a method of the invention.
Figure 3:
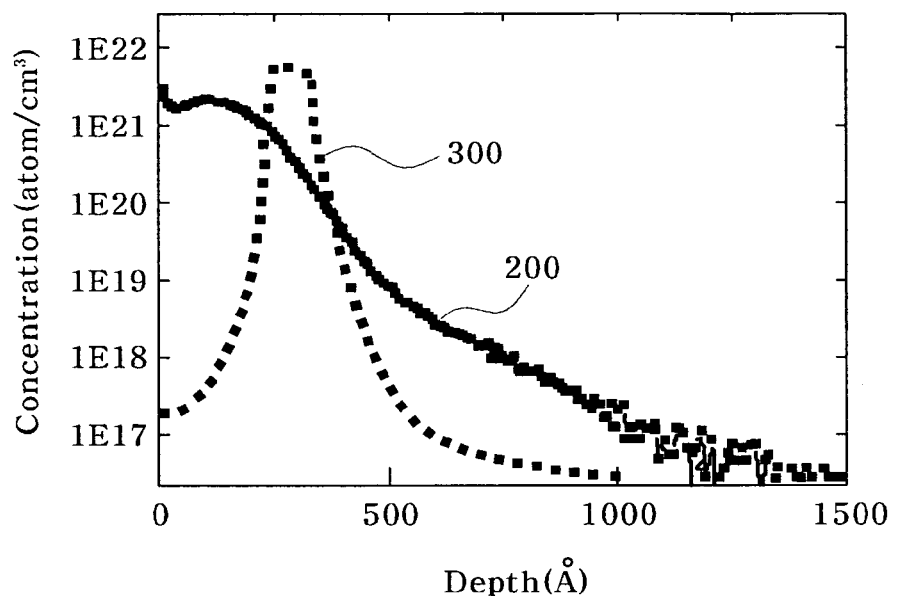
Figure 4:
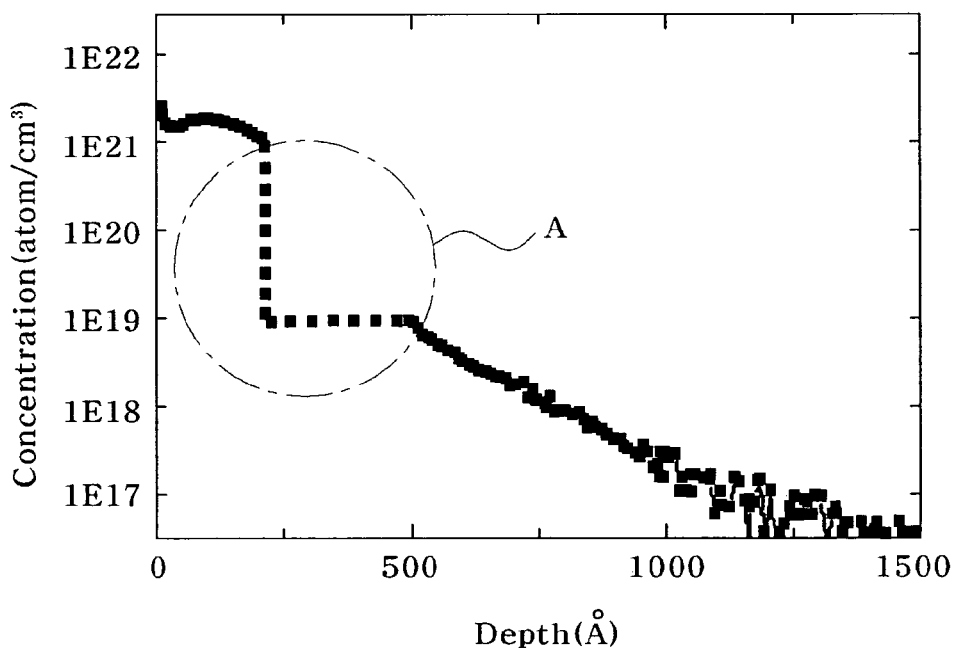
Figure 5:
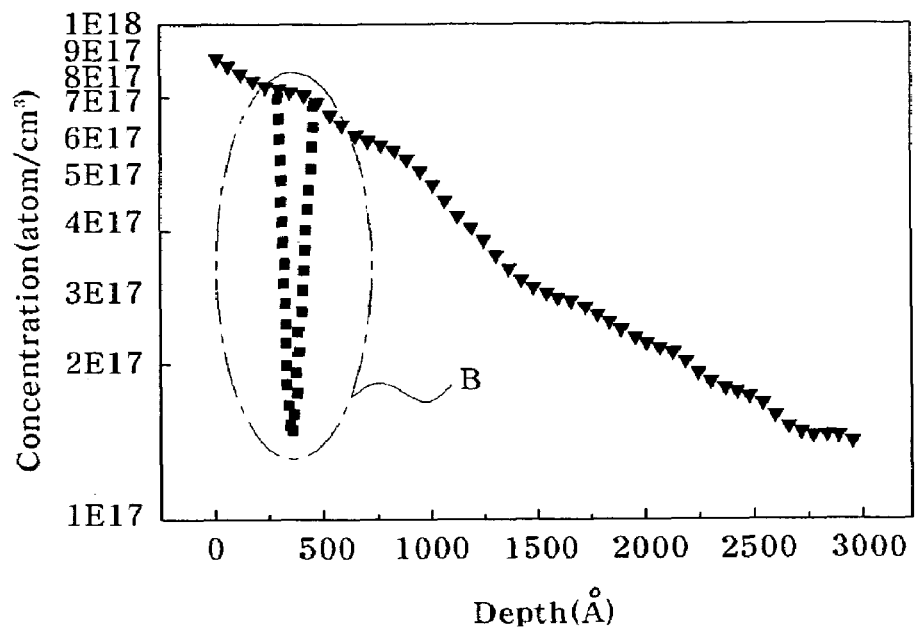

FIG. 2 shows the concentration distribution of dopants (B ions) implanted at a high concentration after the formation of the source region 121 and drain region 122. From the graph of FIG. 2, it is apparent that the B ions are present at the highest concentration around the surface of the junction, i.e. at the left end of the x-axis of the graph, and that the concentration of the B ions decreases with increasing depth of the junction (i.e. as the x-axis value increases) (see, the line denoted by reference numeral "200" in FIG. 2). Referring to FIG. 3, when hydrogen is implanted to a particular target depth, e.g., a depth of about 400 Å from the surface, the concentration of the hydrogen is the highest at a depth of about 400 Å and gradually decreases with increasing and decreasing depth. The implanted hydrogen serves to neutralize the B ions. As shown in FIG. 4, the B ions are neutralized in the particular portion (see, the portion "A" shown in FIG. 4) around a depth of about 400 Å, resulting in a reduction in the concentration of the B ions. Only a few changes in the concentration of the B ions are observed in the other portions. The graphs of FIGS. 2 to 4 show the results measured by secondary ion mass spectroscopy (SIMS), while the graph of FIG. 5 shows the results measured by spreading resistance profiling (SRP). FIG. 5 reveals that the concentration of the dopants activated by hydrogen implantation is reduced at a depth of about 400 Å (see, the portion "B" shown in the figure). The reduction of the concentration of the dopants in the particular portion by hydrogen implantation enables inhibition of short-channel effects without substantially affecting the concentration of the dopants in the other portions, i.e. while minimizing deterioration of the current driving ability of the device. In addition, the reduction of the concentration of the dopants in the particular portion enables increase of punchthrough margin and improvement of leakage current characteristics in the particular portion.

The particular portion where the concentration of the dopants is decreased may be determined through various simulation experiments. Once the particular portion is determined, the particular portion where the concentration of the dopants is decreased can be controlled by varying the energy required for the hydrogen implantation. In addition, the amount of the dopants to be neutralized can be controlled by varying the dose of the hydrogen implanted. For example, when it is intended to achieve increased punchthrough margin and improved leakage current characteristics in a deep portion of a junction, a target for hydrogen implantation is set in a lower portion of the junction and the concentration of dopants to be activated in the lower portion of the junction is decreased. Similarly, when it is intended to achieve increased punchthrough margin and improved leakage current characteristics at the surface of a junction, a target for hydrogen implantation is set in an upper portion of the junction and the concentration of dopants to be activated in the upper portion of the junction is decreased.

Figure 6:
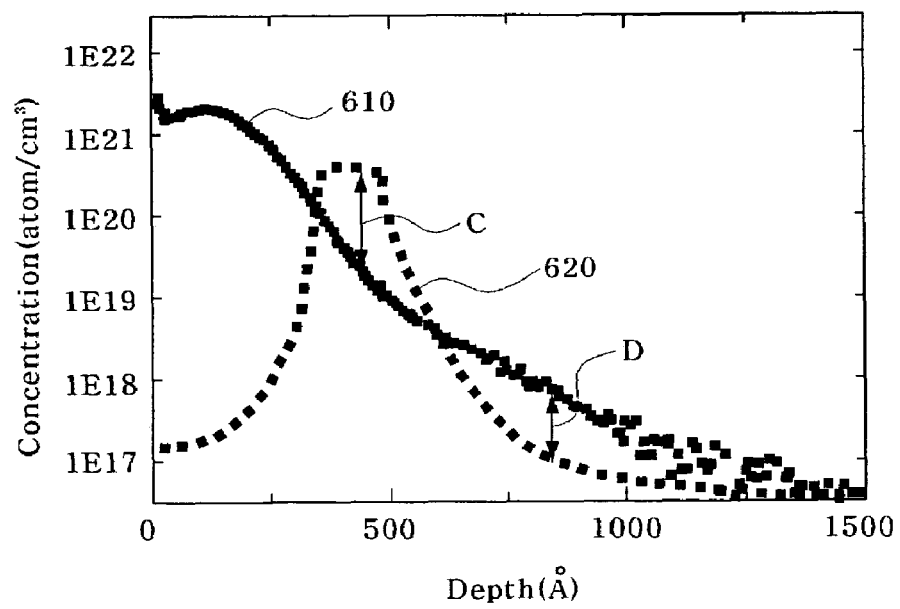
FIGS. 6 and 7 are graphs comparing changes in the concentration of dopants in a junction of a MOS transistor to which halo ion implantation is applied, with changes in the concentration of dopants in a junction of a MOS transistor fabricated in accordance with a method of the invention.
Figure 7:
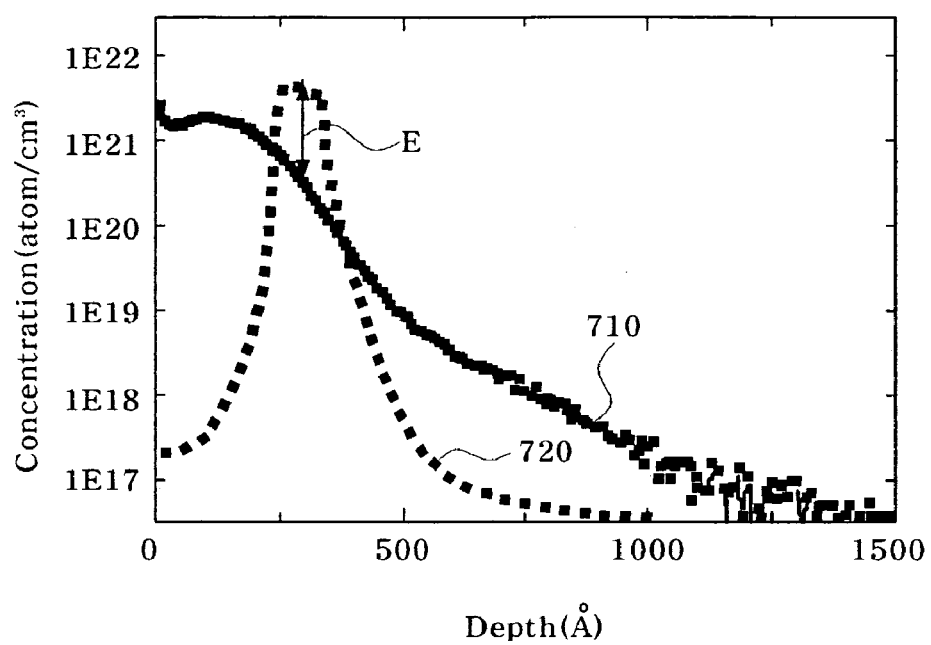

FIGS. 6 and 7 are graphs comparing changes in the concentration of dopants in a junction of a MOS transistor to which halo ion implantation is applied, with changes in the concentration of dopants in a junction of a MOS transistor fabricated in accordance with the method of the invention. FIG. 6 shows changes in the concentration of dopants in a junction of a MOS transistor to which halo ion implantation is applied. The line denoted by reference numeral "610" represents changes in the concentration of dopants of a first conductivity type in source/drain regions, and the line denoted by reference numeral "620" represents changes in the concentration of dopants of a second conductivity type implanted by halo ion implantation. "C" and "D" shown in the figure indicate changes in the concentration of the dopants of a first conductivity type, particularly the concentration of the dopants activated. FIG. 7 shows changes in the concentration of dopants in a junction of a MOS transistor fabricated by hydrogen implantation in accordance with the method of the invention. The line denoted by reference numeral "710" represents changes in the concentration of dopants of a first conductivity type in the source/drain regions 121/122, and the line denoted by reference numeral "720" represents changes in the concentration of hydrogen implanted by hydrogen implantation. "E" shown in the figure indicates changes in the concentration of the dopants of a first conductivity type activated only in a particular portion, that is, around a target depth into which the hydrogen is implanted. FIG. 7 also shows that few changes in the concentration of the dopants activated are observed in the other portions.

Figure 8:
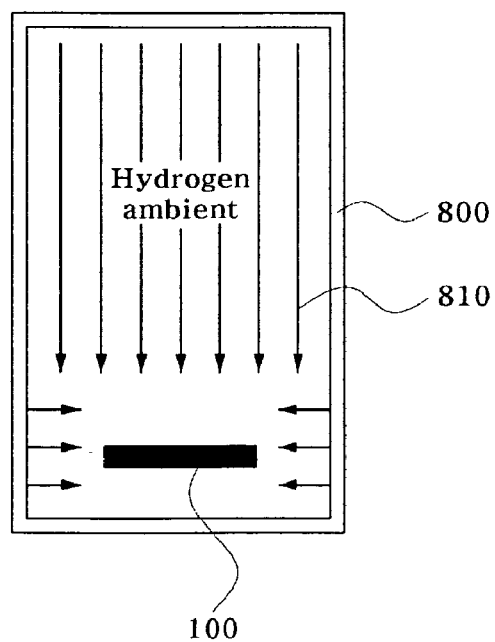
FIG. 8 is a cross-sectional view illustrating a method for fabricating a MOS transistor according to another embodiment of the invention.

FIG. 8 is a cross-sectional view illustrating a method for fabricating a MOS transistor according to another embodiment of the invention. Referring to FIG. 8, hydrogen is fed into junctions by hydrogen annealing in the method of this embodiment, which is distinguished from the method of the previous embodiment by hydrogen implantation. According to the method of this embodiment, an MOS transistor is fabricated by the following procedure. First, a semiconductor substrate 100 is loaded into a furnace 810. As explained with respect to FIG. 1, a gate stack is formed on the semiconductor substrate 100 and ion implantation is performed to form a source region 121 and a drain region 122. Before or after the formation of the gate stack, the source region 121 and the drain region 122, hydrogen is fed into the furnace 800 to create a hydrogen ambient, as indicated by the arrows 810 in FIG. 8. Then, annealing is performed at above a predetermined temperature such that the hydrogen is fed into particular portions of junctions of the source/drain regions. The annealing may be performed by a common heat treatment process. If needed, the annealing may be performed by rapid thermal processing (RTP). Regardless of which process is employed, the particular portions of the junctions of the source/drain regions and the amount of the dopants to be neutralized can be controlled by varying the internal temperature of the furnace 800 and the amount of the hydrogen fed.

What is claimed is:

1. A method for fabricating a metal oxide semiconductor (MOS) transistor, the method comprising:

forming a source region of a first conductivity type and a drain region of the first conductivity type, which are separated from each other by a channel region, in upper regions of a semiconductor substrate;

forming a gate stack over the channel region;

feeding hydrogen only at junctions defined between the channel region and the source and drain regions by a tilt implantation method to neutralize dopants of the first conductivity type present within particular portions of the source and drain regions that are adjacent to the channel region, said feeding hydrogen comprising feeding the hydrogen by hydrogen annealing within a furnace; and controlling the particular portions of the source and drain regions and the amount of the dopants of the first conductivity type to be neutralized by varying the internal temperature of the furnace and the amount of the hydrogen fed by the hydrogen annealing.

2. The method according to claim 1, comprising controlling the particular portions of the junctions by varying the energy required for the implantation of the hydrogen.

3. The method according to claim 1, comprising controlling the amount of the dopants of the first conductivity type to be neutralized in the source and drain regions by varying the dose of the hydrogen implanted.

4. The method according to claim 1, wherein the dopants of the first conductivity type are boron (B) ions or $BF_2$ ions.

5. The method according to claim 1, further comprising forming a well region of a second conductivity type surrounding the channel regions, source regions, and drain regions.

* * * * *